United States Patent [19]
Shimoji

[11] Patent Number: 5,341,010
[45] Date of Patent: Aug. 23, 1994

[54] SEMICONDUCTOR DEVICE INCLUDING NONVOLATILE MEMORIES

[75] Inventor: Noriyuki Shimoji, Kyoto, Japan

[73] Assignee: Rohm Co., Ltd., Kyoto, Japan

[21] Appl. No.: 2,606

[22] Filed: Jan. 11, 1993

[30] Foreign Application Priority Data

Feb. 19, 1992 [JP] Japan ................ 4-032243

[51] Int. Cl.[5] .......................................... H01L 29/78
[52] U.S. Cl. ..................... 251/326; 257/324; 257/316; 365/184
[58] Field of Search ............... 257/326, 324, 316; 365/184, 104

[56] References Cited

U.S. PATENT DOCUMENTS

| | | | |
|---|---|---|---|
| 4,725,986 | 2/1988 | Kouba | 365/104 |
| 4,881,108 | 11/1989 | Yoshikawa | 257/324 |
| 5,172,199 | 12/1992 | Yamauchi et al. | 257/306 |

*Primary Examiner*—Robert Limanek
*Attorney, Agent, or Firm*—Thomas R. Morrison

[57] ABSTRACT

The present invention can provide the memory circuit which has advantages in integration and the manufacturing expense and is easy to manufacture. The nonvolatile memory 21 comprises a P type well for which a N+ type source 4 and a N+ type drain 3 are provided. A surface of a space between the source 4 and the drain 3 comprises a first portion 10a and a second portion 10b. An insulating layer 6 for holding electrons spans the surface of the space. A memory gate electrode 5 is on the insulating layer 6 and spans the first portion 10a. A body 23 of high dielectric material is formed on the surface of the insulating layer 6 so that it connects to the memory gate electrode 5 through an insulating film 8 and spans the second portion 10b.

14 Claims, 7 Drawing Sheets

| mode | selected memory | X1 | X2 | W1 | W2 | B1 | B2 | PW |
|---|---|---|---|---|---|---|---|---|
| writing | C11 | −4 | −4 | 5 | −4 | −4 | 5 | −4 |
| erasing | C11, 12 | −4 | −4 | −4 | 5 | 5 | 5 | 5 |
| reading | C11 | 5 | 0 | 0 | 0 | SA | OPEN | 0 |

F I G. 7A
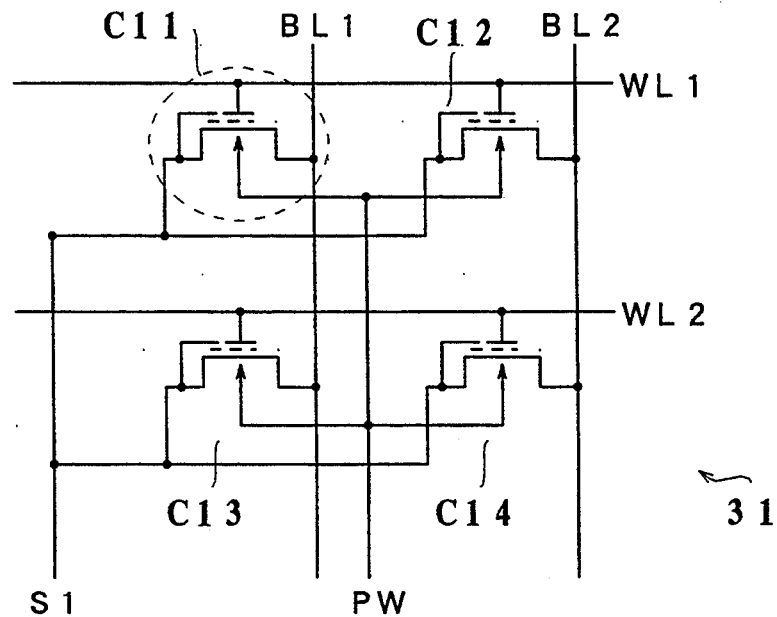
F I G. 7B
|         | BL1  | BL2  | WL1 | WL2 | S1   | PW |
|---------|------|------|-----|-----|------|----|
| writing | 0    | 7    | 10  | 0   | 0    | 0  |
| erasing | OPEN | OPEN | 0   | 10  | OPEN | 10 |
| reading | 0    | OPEN | 2   | 0   | 5    | 0  |

SEMICONDUCTOR DEVICE INCLUDING NONVOLATILE MEMORIES

BACKGROUND OF THE INVENTION

1. Field of the Invention

The present invention relates to a semiconductor nonvolatile memory and, more particularly, improvements in integration, reliability of operation and productivity thereof.

2. Description of the Prior Art

In related art, there is an instance of semiconductor nonvolatile memory 1 as shown in FIG. 1. Referring to FIG. 1, a P type well 2 includes a drain 3 and a source 4, the two region form a space comprising of a region 10a and a region 10b. Between the region 10a and a memory gate electrode 5 is an insulating layer 6 for holding electrons. This insulating layer 6 has a three layer structure: a silicon dioxide layer 6a, a silicon nitride layer 6b, a silicon dioxide layer 6c. The silicon nitride layer 6b and is where electrons can be trapped by bias between the well 2 and the memory gate electrode 5. The insulating layer 6 and a silicon dioxide layer 8 insulate a control gate electrode 7 from both the memory gate electrode 5 and the region 10b.

Region 10b changes from nonconductive to conductive when a stable positive voltage is applied to the control gate electrode 7 and region 10a changes from conductive to nonconductive when a stable positive voltage is applied to the memory gate electrode 5.

Next, the operations of writing data onto and reading data from the nonvolatile memory 1 will be described. To write data onto the memory 1, a positive voltage such as 9 V is applied to the memory gate electrode 5 relative to the drain 3 and the source 4, whereby electrons in the P type well 2 move into the insulating layer 6 and get trapped therein. This change in charge distribution due to the trapped electrons cause the region 10a to change from conductive to nonconductive. These electrons remain trapped in the insulating layer 6 even when the voltage applied to the memory gate electrode 5 is cut off. This state of trapped electrons is referred to as "write state" hereinafter.

To read data from the memory 1, a positive voltage larger than the threshold voltage for the conductive channel of the region 10b is applied to the control gate electrode 7 relative to the drain 3 and the source 4, whereby the region 10b changes from nonconductive to conductive.

The insulating layer 6 has no electrons trapped therein and a voltage is applied to the drain 3 relative to the source 4 a current flows between the drain 3 and the source 4. It is because the regions 10a and 10b are conductive. Conversely, when the insulating layer 6 has electron trapped therein and a voltage is applied to the drain 3 relative to the source 4, no current flows between the drain 3 and the source 4 because the region 10a is nonconductive.

As is described above, it can be determined whether or not the memory 1 is in "write state", by determining whether or not a current flows between the drain 3 and the source 4.

To erase data from the nonvolatile memory, a positive voltage is applied to the P type well 2 relative to the memory gate electrode 5. This application of the voltage causes the electrons trapped in the insulating layer 6 to to return to the p-type well 2.

A memory circuit can be constructed by using the above-mentioned memories 1 which array in rows and columns. The memory circuit is shown in partial view of equivalent circuit 15 in FIG. 2A. As shown in FIG. 2A, each word line W connects to all control memory gate electrodes arrayed in rows and each word line X connects with all control gate electrodes of arrayed in rows and each bit line connects with all memory drains arrayed in a column and a well line PW connects with sources of all of the memories arrayed in rows and columns as well as wells for each of them.

So as not to write data into and read data from memories but a desired memory, the following means can select a desired memory from the memory circuit.

FIG. 2B is a table showing one of combinations of voltages applied to each of the individual lines at writing, erasing and reading operations, the combination being enable the memory circuit to select a desired memory, for example, a memory C11 at writing and reading operations.

More specifically, to write data into the selected memory C11, a voltage of 5 V is applied to both the word line W1 and the bit line B2 and a voltage of −4 V is applied to each of the other individual lines. This permits a positive voltage of 9 V (volts) to be applied to the memory gate electrode 5 of the selected memory C11 relative to the well 2, the source 4 and the drain 3. As a result of this application of voltage, the insulating layer 6 of the selected memory C11 get electrons trapped therein.

Referring to the nonselected memory C12, the voltage of 5 V is applied to the memory gate electrode 5 and thereby causes the region 10a to change to conductive. The voltage of 5 V applied to the drain 3 can travel into the region 10a. Therefore, there is no potential difference between the memory gate electrode 5 and the well 2. Therefore, the insulating layer 6 of the nonselected memory C12 gets no electron trapped therein. Referring to the other nonselected memories C13 and C14, the voltage of −4 V is applied to the memory gate electrode 5. Therefore, the insulating layer 6 gets no electrons trapped therein, respectively.

Note that the voltage of −4 V is applied to the word lines X1 and X2 in order that all the regions 10b of memories C11, C12, C13 and C14 become nonconductive. Therefore, the voltage of 5 V applied to the bit line B2 can travel into the region 10a of the memory C12 without a loss.

Reading operation is effected by applying a voltage of 5 V to a word line X1, applying a positive voltage to the bit line B1 which connects to a sense amplifier, leaving the bit line B2 floating and applying a voltage of 0 V to each of the other individual lines.

Referring to the selected memory C11, the region 10b is conductive because the voltage of 5 V is applied to the control gate electrode 7. When the memory C11 has electrons trapped in the insulating layer 6 the region 10a is nonconductive. Therefore, no current flows through the bit line B1. Conversely, when the memory C11 has no electron trapped in the insulating layer 6 the region 10a is conductive. Therefore, a current flows through the bit line B1.

Referring to the nonselected memory C12, the region 10b is conductive because the voltage of 5 V is applied to the control gate electrode 7. However, since the source 4 is in a voltage of 0 V applied and the bit line B2 is left floating. No current flows through the bit line B2 even when the region 10a is conductive. Referring to the other nonselected memories C13 and C14, the region 10b is nonconductive because the word line X2 is in a voltage of 0 V applied. Therefore, no current flows through bit line B1 and bit line B2 respectively.

As is described above, in the memory circuit, data can be written into and read from a desired memory.

Meanwhile, erasing operation is effected by applying a voltage of −4 V to all of the word line X1, the word line X2 and the word line W1, and applying a voltage of 5 V to the other individual lines.

Referring to the selected memory C11 and C12, since the well line PW has the voltage of 5 V and the memory gate electrode 5 have the voltage of −4 V, the electric field developed between the well 2 and the memory gate electrode 5 make electrons in the insulating layer 6 move into the well 2. That means the data of the memories C11 and C12 has been erased.

Referring to the nonselected memories C13 and C14, since the well 2 have the voltage of 5 V and the memory gate electrode 5 have the voltage of 5 V, no electric field developed between the well 2 and the memory gate electrode 5. Therefore, the data of the memories C13 and C14 is left unchanged.

The above-mentioned memory circuit, however, has the following problem.

Each of the memories in the memory circuit comprises two field effect transistors with a common source and a common drain.

These two field effect transistors bar the memory cell and the memory circuit from integrating and being manufactured easily.

Meanwhile, in order to control the conductivity of the region 10b by application of electric field between the well 2 and the control gate electrode 7, it is necessary to arrange a certain width of the region 10b correctly in manufacturing process. This width W is determined by a width of a photoresist pattern using as a mask. In lithography, it is difficult to meet the photoresist pattern mask to a predetermined position in the substrate. Therefore, it is difficult to arrange the region 10b with a predetermined width.

SUMMARY OF THE INVENTION

Accordingly, it is an object of the present invention to provide nonvolatile semiconductor memory that comprises one-transistor cells and that has advantages in integrating the cell and in cutting down the manufacturing expense.

A semiconductor device including nonvolatile memories according to one embodiment of the present invention comprises:

a) a substrate of semiconductor, b) a first region formed in the surface of the substrate, c) a second region formed in the surface of the substrate and defining a space between the first region and the second region, the surface of the space comprising a first portion and a second portion, d) an insulating layer for holding electrons spanning the first portion, e) a control electrode being on the insulating layer and spanning the first portion, and f) a dielectric body which spans the second portion and is adjacent to the control electrode.

A method for manufacturing a semiconductor device including nonvolatile memories according to one embodiment of the present invention comprises the steps of:

a) preparing a substrate of semiconductor, b) depositing an insulating layer for holding electrons on all surfaces of the substrate, c) covering a part of the surface of the insulating layer with a control electrode wherein a portion of the surface of the substrate spanned by the control electrode is defined as a first portion, d) covering a part of the surface of the insulating layer adjacent to the control electrode with an insulating body wherein a portion of the surface of the substrate spanned by the insulating body is defined as a second portion e) implanting a dopant into the substrate using both the insulating body and the control electrode as a mask so that a first region and a second region are created in the substrate, A method for operating memories, which is comprised of a substrate of semiconductor, a source formed in the surface of the substrate, a drain formed in the surface of the substrate and defining a space between the source and the drain, the surface of the space comprising a first portion and a second portion, an insulating layer for holding electrons spanning the first portion, a memory gate electrode being on the insulating layer and spanning the first portion, and a dielectric body which spans the second portion and is adjacent to the memory gate electrode, according to one embodiment of the present invention:

a) arraying the memories in rows and columns, b) connecting each of drain lines to all the drains of the memories arrayed in a row, c) connecting each of gate lines to all the memory gate electrodes of the memories arrayed in a column, d) connecting a source line to all the sources of the memories arrayed in rows and columns, e) writing data into a desired memory, applying a programming voltage to a gate line connecting with the desired memory and applying a voltage to the drains of the undesired memories in order not to write data into the undesired memories, and f) reading data from a desired memory, determining whether or not a current flows through a drain line connecting to the drain of the desired memory when a sense voltage is applied to a gate line connecting with the memory gate electrode of the desired memory as well as applying a reading voltage to the source line.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 7A is a partial equivalent view showing the memory circuit 31 constructed by using the nonvolatile memory 21 and FIG. 7B is a table showing an example of combinations of voltages applied to each of the individual lines during the writing, erasing and reading operations.

DETAILED DESCRIPTION OF THE INVENTION

An embodiment according to the present invention will be described with reference to the figures.

Figure 1:
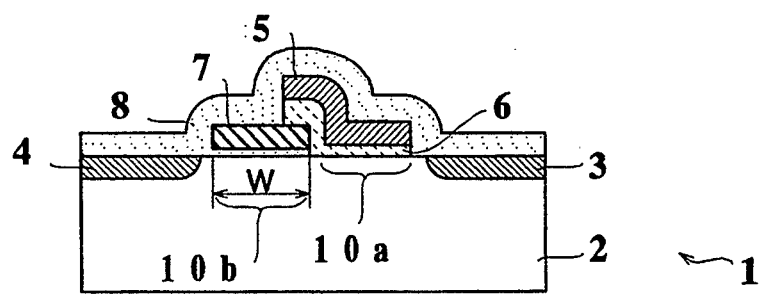
FIGS. 1A–1B are sectional views showing schematically a nonvolatile memory 1 according to prior art.
Figure 1:
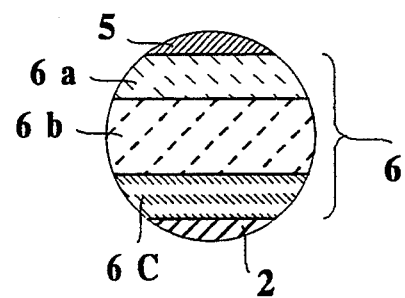
Figure 2:
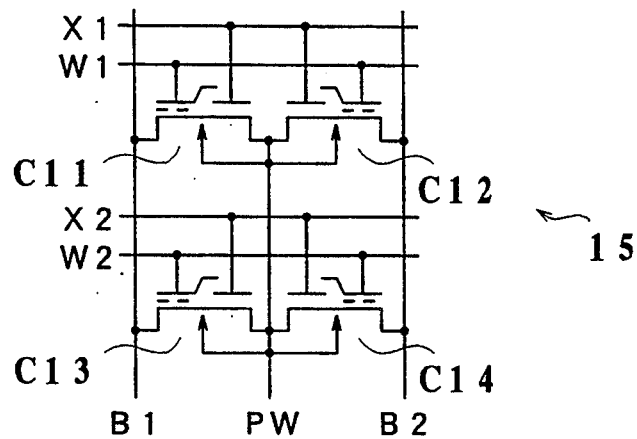
FIG. 2A is a partial equivalent view showing a memory circuit constructed by using the nonvolatile memory 1 and FIG. 2B is a table showing an example of combinations of voltages applied to each of the individual lines at writing, erasing and reading operation.
Figure 3:
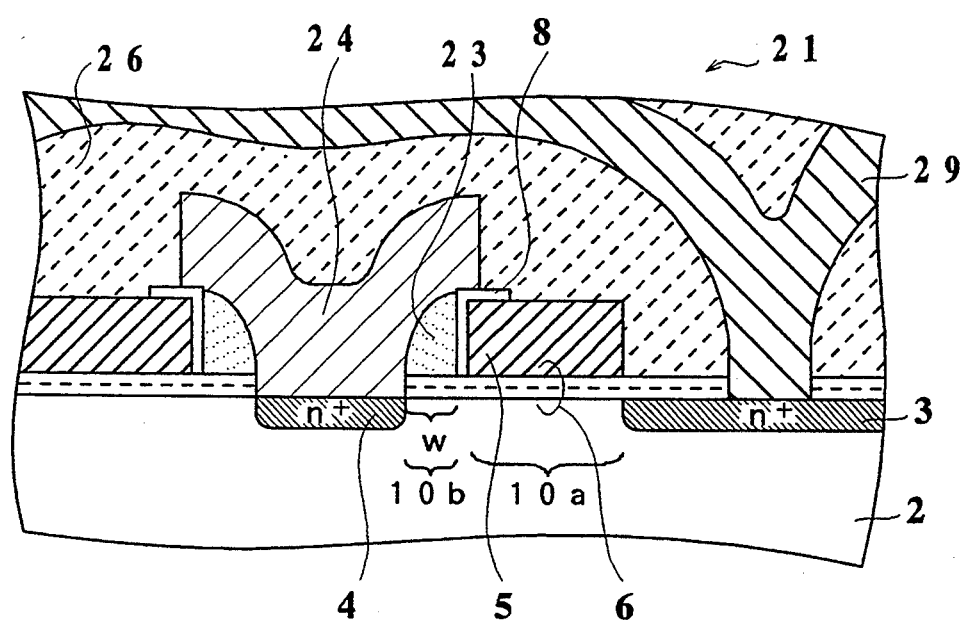
FIG. 3 is a sectional view showing schematically a nonvolatile memory 21 according to an embodiment of the present invention.

FIG. 3 shows a nonvolatile memory 21 according to the embodiment of the present invention. Referring to FIG. 3, the nonvolatile memory 21 comprises a substrate of semiconductor in which a P type well 2 is formed, for the surface of the well 2 a source 4 of a first region and a drain 3 of a second region being provided. Both the source 4 and the drain 3 is a diffusion layer of N+ type conductivity. A surface of a space between the source 4 and the drain 3 comprises a first portion 10a and a second portion 10b, the conductivity of which can be controlled by application an electric field.

An insulating layer 6 for holding electrons spans the surface of the space including the first portion 10a and the second portion 10b, and is structured in three layers: a silicon dioxide layer 6a, a silicon nitride layer 6b, and a silicon dioxide layer 6c, as the memory mentioned in the Description of the Prior Art. The silicon nitride layer 6b is where electrons can be trapped by applying a bias between the well 2 and a memory gate electrode 5 of a control electrode, the memory gate electrode 5 being on the insulating layer 6 and spanning the first portion 10a. A dielectric body 23 of high dielectric material is on the insulating layer 6 and connected to the memory gate electrode 5 through an insulating film 8, spanning the second portion 10b. Although in the preferred embodiment the high dielectric body 23 is made of tantalum pentoxide ($Ta_2O_5$), in alternative embodiments it may comprise any one of the known high dielectric materials, such as lead zirconate titanate (PZT) and strontium titanate ($SrTiO_3$).

A source electrode 24 is attached to the source 4, covering the high dielectric body 23. The insulating layer 8 insulates the source electrode 24 from the memory gate electrode 5. The entire surface of both the source electrode 24 and the memory gate electrode 5 is covered with an insulating layer 26 on which is formed a bit line 29 of aluminum connecting to all drains 3 arrayed in a row (not shown).

The operation of writing data into and erasing data from the nonvolatile memory 21 will be described. To write data into the memory 21, a positive voltage is applied to the memory gate electrode 5 relative to the drain 3 and the source 4, whereby electrons in the P type well 2 move into the insulating layer 6 and get trapped therein. This change in charge distribution due to the trapped electrons cause the region 10a to change from conductive to nonconductive. These electrons remain trapped in the insulating layer 6 even when the voltage applied to the memory gate electrode 5 is cut off. This state wherein electrons are trapped in the insulating layer 6 is referred to as "write state" hereinafter.

To erase data from the nonvolatile memory 21, a positive voltage is applied to the P type well 2 relative to the memory gate electrode 5. This application of the voltage cause the electrons trapped in the insulating layer 6 to return the well 2. This erases the data stored in the memory.

To read data from the nonvolatile memory 21, a "sense" voltage of 5 V is applied to the memory gate electrode 5, a "reading" voltage of 5 V is applied to the source electrode 24 and a voltage of 0 V to the well 2. Note that "sense" voltage is a voltage applied to the memory gate electrode 5 relative to the well 2 which lies between such a minimum voltage in which the first portion 10a can change from nonconductive to conductive when the insulating layer 6 has electrons trapped therein, and such a minimum voltage in which the first portion 10a changes from nonconductive into conductive when the insulating layer 6 have no electrons trapped therein. That is, when a sense voltage is applied to the memory gate electrode 5 of a memory in "write state", the regions 10a remain nonconductive. Conversely, when a sense voltage is applied to the memory gate electrode 5 of a memory not in "write state", the region 10a changes into conductive.

Note that when "reading voltage" is a voltage applied to the source 4 which can change the second portion 10b from nonconductive to conductive without making electrons in the well 2 trapped in the insulating layer 6. Therefore, in this embodiment, a reading voltage of 2 V may be applied to the source 4.

The theory that the second portion changes from nonconductive to conductive when the reading voltage is applied to the source as follows:

The source electrode 24 is formed on the high dielectric body 23 so that it spans the second portion 10b. When a reading voltage is applied to the source electrode 24 a electric field is developed between the source electrode 24 and the well 2 whereby the second portion 10b changes from nonconductive to conductive.

Since the reading voltage, as is described above, is applied the to the source electrode 24, the second portion 10b changes to conductive. At the same time, there is a potential difference between the source 4 and the drain 3. Therefore, when the memory is not in "write state" a current flows between the source 4 and the drain 3 because the first portion 10a and the second portion 10b is conductive. On the other hand, when the memory is in "write state" no current flows between the source 4 and the drain 3 because of the first portion 10a.

As is described above, it can be determined whether or not the memory 21 is in "write state", by determining whether or not a current flow between the drain 3 and the source 4.

The intensity of the electric field developed by a sense voltage is proportional to the magnitude of voltage applied to the source and the dielectric constant of the high dielectric body, and inversely proportional to a distance from the source electrode 24 to the well 2. Therefore, the material of high dielectric such as tantalum pentoxide ($Ta_2O_5$) form the high dielectric body 23 and thereby can intensify the electric field between the source electrode 24 and the well 2. Therefore, even when a relatively low positive voltage is applied to the source electrode 24 the second portion 10b can change to conductive.

A memory circuit 31 can be composed of the above-mentioned memories 21 which are arrayed in rows and columns. The memory circuit 31 is shown in partial view of equivalent circuit in FIG. 7A. As shown in FIG. 7A, each of the word lines WL1 and WL2 of gate lines connects with all the memory gate electrodes 5 of memories arrayed in a row, each of the bit lines BL1 and BL2 of drain lines connects with all the drains of memories arrayed in a column, a source line S1 connects with all the source 4 of memories arrayed in rows and columns and a well line PW connects with all of the wells 2 of the memories arrayed in rows and columns.

So as not to write data into and read from memories but a desired memory, the following means can select the desired memory from the memory circuit 31.

FIG. 7B is a table showing one of the combinations of voltages applied to each of the individual lines during a writing, erasing and reading operation, the combination permitting the memory circuit to select the desired memory, specifically, a memory C11 during the writing and reading operation.

More specifically, to write data onto the selected memory C11, a "programming" voltage of 10 V is applied to the word line WL1, a voltage of 7 V is applied to the bit line BL2 and a voltage of 0 V is applied to the other individual lines.

Returning to FIG. 7A and referring to the selected memory C11, the memory gate electrode 5 has a positive potential relative to all of the well 2, the source 4 and the drain 3, and thereby electrons in the well 2 get trapped in the insulating layer 6.

Note that "programming" voltage is a voltage applied to the memory gate electrode 5 relative to all of the well 2, the source 4 and the drain 3 whereby electrons in the well 2 move to the insulating layer 6 and get trapped therein.

Referring to the nonselected memory C12, the first portion 10a is conductive because the programming voltage of 10 V is applied to the memory gate electrode 5 relative to the well 2. Therefore, as the voltage of 7 V is applied to the drain 3 the first portion 10a gets the voltage of 7 V. At that time, there does not produce a potential difference between the memory gate electrode 5 and the well 2, enough to have electrons trapped in the insulating layer 6.

Referring to the other nonselected memories C13 and C14, both of the second portions 10b are nonconductive because a voltage of 0 V is applied to the memory gate electrode 5 relative to the drain 3.

Note that the second portion 10b of memories C12 and C14 remain nonconductive because of the voltage of 0 V applied to the source line S1. Therefore, the voltage of 7 V applied to the bit line BL2 can travel into the second portion 10a of the memory C12 with no loss.

Reading operation is effected by applying a "sense" voltage of 5 V to the word line WL1, applying a "reading" voltage of 5 V to the source line S1, leaving the bit line BL2 floating and applying a voltage of 0 V to each of the other individual lines.

Referring to the selected memory C11, the second portion 10b is conductive because the reading voltage of 5 V is applied to the source line S1 (see FIG. 3).

When the insulating layer 6 has electrons trapped therein, even when the sense voltage of 5 V is applied to the word line WL1 the first portion 10a remains nonconductive. Therefore, no current flows between the source 4 and the drain 3. Conversely, when the insulating layer 6 has no electrons trapped therein and the sense voltage of 5 V is applied to the word line WL1, the first portion 10a change to conductive. Therefore, a current flows between the source 4 and the drain 3.

Referring to the nonselected memory C12, the second portion 10b is conductive because the reading voltage of 5 V is applied to the source line S1. The bit line BL2 is left floating. Therefore, no current flows between the source 4 and the drain 3 even when the first portion 10a is conductive. Referring to the nonselected memories C13 and C14, because the word line WL2 have the voltage of 0 V applied thereto and both of the second portions 10b are nonconductive accordingly, no current flows between the source 4 and the drain 3 respectively.

At that time, a sense amplifier (not shown) connecting to the bit line BL1 can detect whether or not a current flows through the bit line BL1.

As is described above, in the memory circuit 31, data can be written into and read from a desired memory.

Meanwhile, the erasing operation is effected by applying a voltage of 10 V to both the well line PW and the word line WL2, applying a voltage of 0 V to the word line WL1, and leaving the bit lines BL1 and BL2, and the source line S1 floating.

Referring to the selected memories C11 and C12, since the well line PW have the voltage of 10 V and the memory gate electrode 5 have the voltage of 0 V, the electric field developed between the well 2 and the memory gate electrode 5 make electrons in the insulating layer 6 move into the well 2. That means the data of the memories has been erased.

Referring to the nonselected memories C13 and C14, since the well 2 has the voltage of 10 V and the memory gate electrode 5 has the voltage of 10 V, no electric field develops between the well 2 and the memory gate electrode 5. Therefore, the data of the memories remains unchanged.

Note that when the voltage of 10 V is applied to both the word line WL2 and the word line WL1 data can be erased from all the memories at the same time.

As is described above, the memory circuit 31 is characterized in that the source electrode 24 spans the high dielectric body 23 spanning the second portion 10b.

Therefore, it is effected by applying a reading voltage to the source electrode 24 to control the conductivity of the second portion 10b. When the reading voltage is applied to the source 4 during the reading operation the second portion 10b change into conductive and thereby the sense amplifier connected to the bit line BL1 can detect whether or not current flows through the bit line BL1.

Note that the width D of the insulating body 23 is determined by thickness of the layer 33. Furthermore, the thickness of the layer 33 can be controlled correctly. Therefore, the width D of the high dielectric body 23 can be controlled correctly.

The manufacturing process for a memory circuit constructed by using the memories 21 will be described below.

Figure 4A:
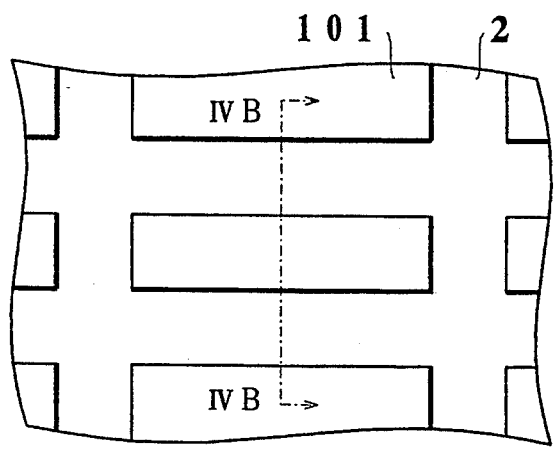
FIGS. 4A through 4E are partial views showing the manufacturing process of the memory circuit 31 constructed by using the nonvolatile memory 21.
Figure 4B:
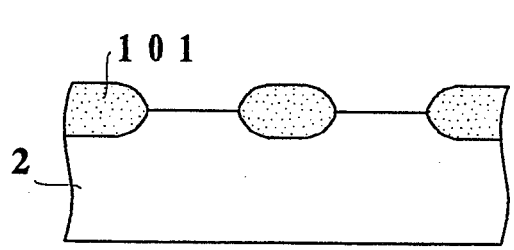

Field oxide layers are formed in a well 2 which are provided for a substrate of semiconductor as shown in FIG. 4A by the Local Oxidation of Silicon (LOCOS) technique to divide the substrate into plural insulated islands. Note that FIG. 4B is a IVB—IVB sectional view of FIG. 4A. In the embodiment, the depth of the field oxide layer is 600 nm.

Figure 4C:
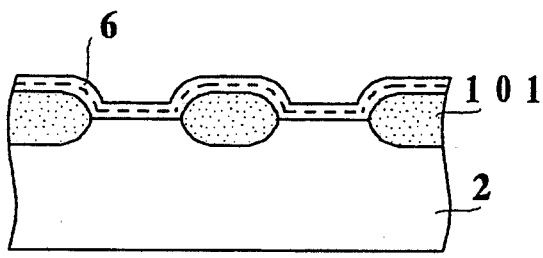

After cleaning the substrate, a silicon dioxide layer 2 nm in thickness is formed on the substrate by partial oxidation technique. A silicon nitride layer 10 nm in thickness is deposited on top of the silicon dioxide layer by Low pressure CVD (chemical vapor deposition) technique. A silicon dioxide layer 5 nm in thickness is formed on the silicon nitride by a wet oxidation technique. An insulating layer for holding electrons consists of the three layers applied in this way as shown in FIG. 4C.

Figure 4D:
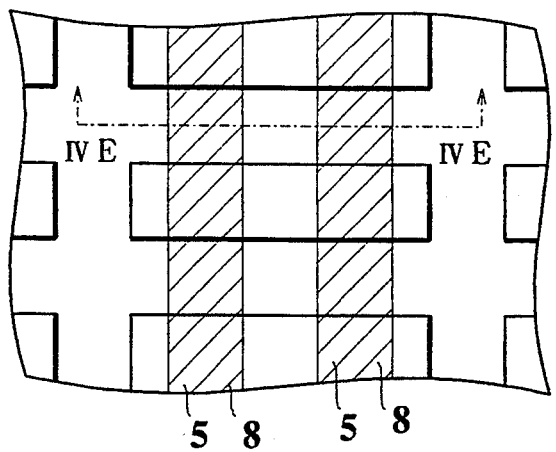
Figure 4E:
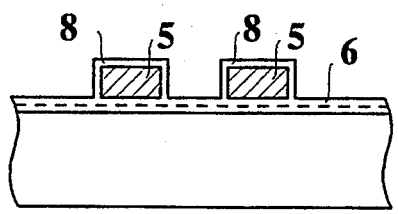

Thereafter, as shown in FIG. 4D, layers of polycide are deposited on top of the insulating layer 6 and form into a memory gate electrode 5 by an etching technique. The entire surface of the memory gate electrode 5 is then oxidized. FIG. 4E is a IVE—IVE sectional view of FIG. 4D.

Figure 5A:
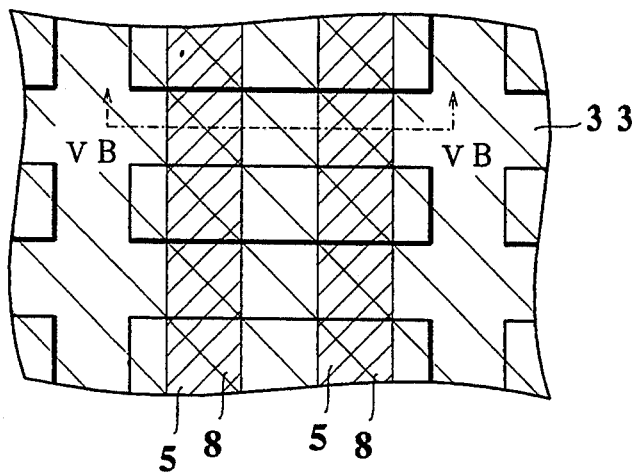
FIGS. 5A through 5D are partial views showing the manufacturing process of the memory circuit 31.
Figure 5B:
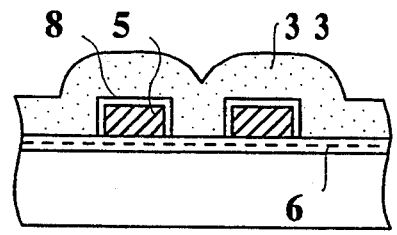
Figure 5C:
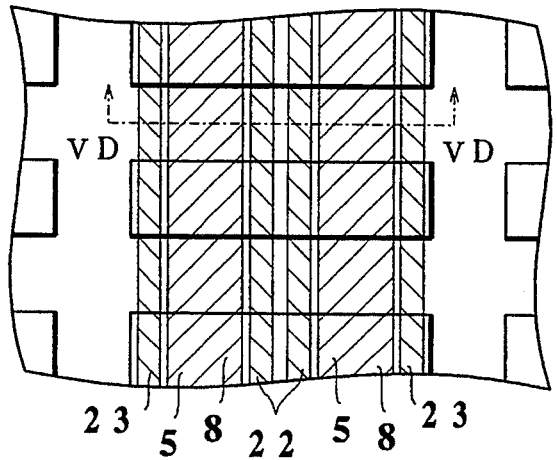
Figure 5D:
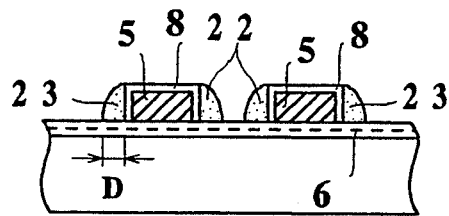

Next, on top of the resulting substrate, a high dielectric layer 33 of tantalum pentoxide (Ta$_2$O$_5$) is deposited as shown in FIGS. 5A and 5B the CVD technique. FIG. 5B is a VB—VB sectional view of FIG. 5A. Note that the high dielectric layer 33 may be deposited the deposition sputtering method. Thereafter, the resulting substrate is subjected to an anisotropic etching technique such as reactive ion etching (RIE) whereby high dielectric bodies 22 and 23 of tantalum pentoxide (Ta$_2$O$_5$) are formed on both sides of the memory gate electrode 5 and remain on the insulating layer 6 as shown in FIGS. 5C and 5D. FIG. 5D is a VD—VD sectional view to FIG. 5C.

Note that isotropic etching is a technique of etching in both the lateral direction and the vertical direction while anisotropic etching is a technique of etching in only the vertical direction.

Reactive ion etching may continue until the surface of the insulating layer 6 is exposed. But reactive ion etching may continue a few times after the surface of the ferroelectric film 106 is exposed. That is because reactive ion etching is the technique of etching in only the vertical direction and therefore has little influence on the width of the insulating body 23. Therefore, the width D of the high dielectric body 23 can be controlled easily and Therefore, the width of the region 10b can be controlled easily.

Specifically, the width D of the insulating body 23 is determined by thickness of the layer 33. Furthermore, the thickness of the layer 33 can be controlled correctly.

Figure 6A:
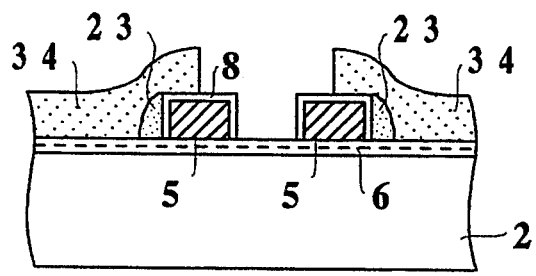
FIGS. 6A through 6D are partial views showing the manufacturing process of the memory circuit 31.
Figure 6B:
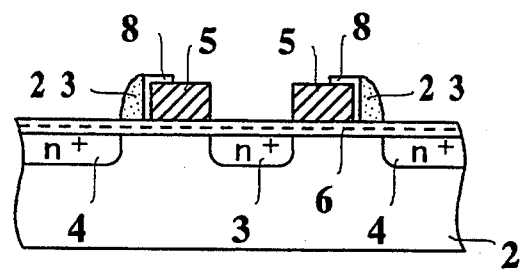

Referring to FIG. 6A, after the high dielectric bodies 23 on one side of the memory gate electrode 5 and the portion of the silicon oxide layer are then covered with a mask of photoresist the high dielectric bodies 22 on the other side of the memory gate electrode are removed by the etching technique. When a source electrode 24 is formed after that time, the remaining silicon oxide layer 8 is used to insulate the source electrode 24 from the memory gate electrode 5. Referring to FIG. 6B, after the mask of photoresist is removed the substrate is subjected to an ion implantation step wherein sources and drains of N+ type diffusion regions are formed in the well 2.

Figure 6C:
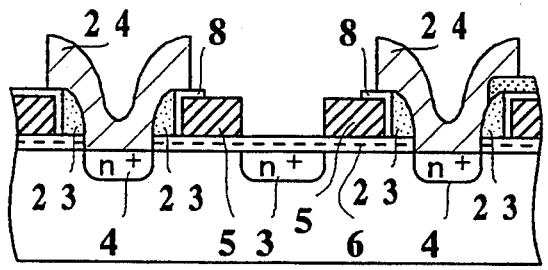

Referring to FIG. 6C, a layer of polycide is then deposited on the entire surface of the substrate and form into the source electrode 24 by etching a photoresist pattern as a mask.

Figure 6D:
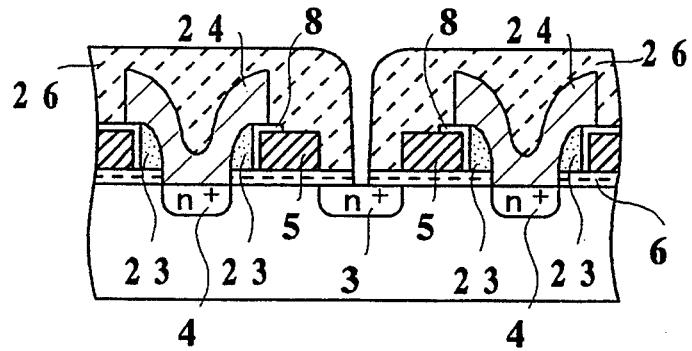

Referring to FIG. 6D, after an insulating layer 26 of silicon dioxide is deposited on the entire surface of the resulting substrate by the CVD technique an opening for an electrode to be attached to the drain 3 is created in the insulating layers 6 and 26. A layer of silicon aluminum is deposited on the surface of the resulting substrate. The layer forms form into bit lines 29 which are drain lines etched by using a photoresist pattern as a mask (see FIG. 3).

As a result, a layer (not shown) of passivation is formed on the entire of the resulting substrate.

Although in the preferred embodiment the insulating layer 6 of the memory comprises the silicon dioxide layer 6a, the silicon nitride layer 6b and the silicon dioxide layer 6c, in alternative embodiments an insulating layer may be comprised of a silicon dioxide layer, a silicon nitride layer, and any other layer provided that the layer can holding electrons during a writing operation.

In the preferred embodiment the high dielectric body is made of high dielectric material. This fact can change the second portion 10b from nonconductive to conductive even when a relatively low positive voltage is applied to the source electrode 24. This reduces the dissipation of power of the above-mentioned memory. When a memory of another embodiment according to the present invention suffers from the high voltage applied to the source 4, silicon oxide of low dielectric material may be used as the dielectric material.

Although in the preferred embodiment the source 4 and the drain 3 are semiconductors of the N+ type and the first portion 10a and the second portion 10b are semiconductors of the P type, in alternative embodiments the two regions may also be semiconductors of the P type and the two portions may be semiconductor of N+ type.

The memory circuit and manufacturing method according to the above-described embodiment is characterized in that it is easy to control the length of the second portion 10b, that the second portion 10b can change from nonconductive to conductive when the reading voltage is applied to the source electrode 24. Therefore, the second portion 10b can be used as a switch. This permits the memory circuit to be constructed by using a one-transistor cell. That is, the present invention can provide the memory circuit which has advantages in integration and the manufacturing expense is easy to manufacture, compared with the memory circuit constructed by using a two-transistor cell.

The method of operating the memory circuit according to the above-described embodiment is characterized in that data is able to be written into and read from a desired memory cell in the memory circuit without mistakes. As a result of this, compared with the memory circuit constructed by using a two-transistor cell, the above-mentioned memory circuit has advantages in integrating the memory circuit as well as its memory cell, and in cutting down the manufacturing expense.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A semiconductor device including nonvolatile memories comprising:
   a substrate of semiconductor;
   a first region formed in the surface of the substrate;
   a second region formed in the surface of the substrate and defining a space between the first region and the second region, the surface of the space comprising a first portion and a second portion;
   an insulating layer for holding electrons spanning the first portion;
   a control electrode on the insulating layer for holding electrons and spanning the first portion, the control electrode having a side surface;

a dielectric body which is formed of a high dielectric material and which spans the second portion adjacent to the side surface of the control electrode; and a first region electrode contacting the first region and the dielectric body, which is electrically isolated from the control electrode.

2. A semiconductor device including nonvolatile memories according to claim 1, wherein the insulating layer comprises a silicon dioxide layer, a silicon nitride layer on the silicon dioxide layer and a silicon dioxide layer on the silicon nitride layer.

3. A semiconductor device including nonvolatile memories according to claim 1, wherein the insulating layer comprises a silicon dioxide layer and a silicon nitride layer on the silicon dioxide layer.

4. A semiconductor device including nonvolatile memories according to claim 1, wherein the first region and the second region are made of semiconductor of P type conductivity and the first portion and the second portion are made of semiconductor of N type conductivity.

5. A semiconductor device including nonvolatile memories according to claim 1, wherein the first region and the second region are made of semiconductor of N type conductivity and the first portion and the second portion are made of semiconductor of P type conductivity.

6. A semiconductor device including nonvolatile memories according to claim 1, wherein the first region is a source, the second region is a drain and the control electrode is a memory gate electrode.

7. A semiconductor device including nonvolatile memories according to claim 1, further comprising:

an insulator layer between the second portion and the body of high dielectric material.

8. A semiconductor device including nonvolatile memories according to claim 7, wherein the insulating layer is to hold electrons.

9. A method for operating memories of claim 6 comprising:

arraying the memories in rows and columns;

connecting drain lines to the drains of the memories arrayed in each of said rows;

connecting gate lines to the memory gate electrodes of the memories arrayed in each of said columns;

connecting a source line to the sources of all the memories arrayed in said rows and columns; and reading data from a selected memory by determining whether a current flows through a drain line connected to the drain of the selected memory when a sense voltage is applied to a gate line connected to the memory gate electrode of the selected memory as well as applying a reading voltage to the source line wherein said reading voltage renders said second portion of said substrate conductive.

10. A semiconductor device, according to claim 1, wherein a height of said dielectric body is substantially the same as that of said control electrode, and a width of the dielectric body is smaller than said height.

11. A semiconductor device, according to claim 1, wherein said dielectric body is formed by anisotropic etching a high dielectric material layer provided on an entire surface of said substrate.

12. A semiconductor device, according to claim 1, wherein the high dielectric material is $Ta_2O_5$.

13. A semiconductor device, according to claim 1, wherein the high dielectric material is PZT.

14. A semiconductor device, according to claim 1, wherein the high dielectric material is $SrTiO_3$.

* * * * *